(12) United States Patent
Kunz, Jr. et al.

(10) Patent No.: US 9,629,294 B2
(45) Date of Patent: Apr. 18, 2017

(54) PACKAGED DEVICE FOR DETECTING FACTORY ESD EVENTS

(71) Applicant: Texas Instruments Incorporated, Dallas, TX (US)

(72) Inventors: John Eric Kunz, Jr., Allen, TX (US); Jonathan Scott Brodsky, Richardson, TX (US); Gianluca Boselli, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 521 days.

(21) Appl. No.: 14/101,419

(22) Filed: Dec. 10, 2013

(65) Prior Publication Data

US 2014/0184237 A1     Jul. 3, 2014

Related U.S. Application Data

(60) Provisional application No. 61/746,870, filed on Dec. 28, 2012.

(51) Int. Cl.
| | |
|---|---|
| *G01R 31/00* | (2006.01) |
| *H05K 13/08* | (2006.01) |
| *H01L 21/66* | (2006.01) |
| *H01L 27/02* | (2006.01) |

(52) U.S. Cl.
CPC .......... *H05K 13/08* (2013.01); *G01R 31/001* (2013.01); *H01L 22/34* (2013.01); *H01L 27/0292* (2013.01); *H01L 2224/48247* (2013.01); *H01L 2224/48465* (2013.01); *H01L 2924/1305* (2013.01); *H01L 2924/13034* (2013.01); *H01L 2924/13062* (2013.01); *H01L 2924/13091* (2013.01); *Y10T 29/49004* (2015.01)

(58) Field of Classification Search
CPC .... G01R 31/001; H05K 13/08; H01L 27/092; H01L 22/34
USPC .. 324/500, 522, 525, 548–549, 555, 762.01, 324/762.07, 762.08, 762.09, 600, 649, 324/691, 713; 702/57, 64, 108, 117, 118, 702/182–183, 189
See application file for complete search history.

(56) References Cited

U.S. PATENT DOCUMENTS

| | | | | |
|---|---|---|---|---|
| 5,359,211 | A | * | 10/1994 | Croft ................... H01L 27/0251 257/173 |
| 5,969,626 | A | * | 10/1999 | Maciel ................. G01R 31/026 324/510 |

(Continued)

*Primary Examiner* — Christopher Mahoney
(74) *Attorney, Agent, or Firm* — Jacqueline J. Garner; Charles A. Brill; Frank D. Cimino (57) ABSTRACT

An ESD monitor device may take the form of an integrated circuit with a plurality of monitor components available at each I/O site of the ESD monitor device. Each monitor component has a physical structure which provides scalable ESD robustness. The monitor components are connected in parallel to an ESD bus. An integrated circuit may be formed by processing an ESD monitor device through one or more process steps of an integrated circuit manufacturing line, and subsequently measuring the ESD monitor device. Parameters of a process step of the manufacturing line may be adjusted to reduce ESD events at the process step, based on measurement results from the ESD monitor device. The integrated circuit may subsequently be processed through the adjusted process step.

19 Claims, 8 Drawing Sheets

(56) References Cited

U.S. PATENT DOCUMENTS

| | | | | |
|---|---|---|---|---|
| 2003/0007301 | A1* | 1/2003 | Ker | H01L 27/0262 361/111 |
| 2004/0027742 | A1* | 2/2004 | Miller | H01L 27/0251 361/52 |
| 2009/0287435 | A1* | 11/2009 | Ker | G01R 19/0053 702/64 |
| 2009/0309129 | A1* | 12/2009 | Domanski | H01L 27/0262 257/133 |
| 2011/0051299 | A1* | 3/2011 | Hiraoka | H01L 27/0255 361/56 |
| 2012/0268848 | A1* | 10/2012 | Lin | H02H 9/046 361/56 |
| 2013/0208395 | A1* | 8/2013 | Bultitude | H01G 4/30 361/275.1 |
| 2014/0126089 | A1* | 5/2014 | Chang | H02H 9/046 361/56 |
| 2015/0236011 | A1* | 8/2015 | Wang | H01L 27/0262 257/173 |

* cited by examiner

PACKAGED DEVICE FOR DETECTING FACTORY ESD EVENTS

CROSS-REFERENCE TO RELATED APPLICATIONS

This application claims the benefit of priority under U.S.C. §119(e) of U.S. Provisional Application 61/746,870 filed Dec. 28, 2012, which is hereby incorporated by reference in its entirety.

FIELD OF THE INVENTION

This invention relates to the field of integrated circuits. More particularly, this invention relates to methods of forming integrated circuits.

BACKGROUND OF THE INVENTION

Electrostatic discharge (ESD) is a continuing problem in the design, manufacture, and utilization of integrated circuits. A major source of ESD exposure to integrated circuits is from the human body, described by the Human Body Model. In this situation, a packaged integrated circuit acquires a charge when it is touched by a human who is electrostatically charged (e.g. from walking across a carpet). A charge of about 0.4 uC may be induced on a body capacitance of 100 pF, for example, leading to an electrostatic potential of 4 kV or more and discharge peak currents of several amperes to the integrated circuit for longer than 100 ns. A second source of ESD exposure is from charged metallic objects, described by the Machine Model, which is characterized by a greater capacitance, lower internal resistance and transients that have significantly higher peak current levels than a Human Body Model ESD source. A third source of ESD exposure is due to the discharge of stored charge on the integrated circuit itself, described by the Charged Device Model, in which the stored charge is discharged to ground with rise times of less than 500 ps. For all three sources of ESD exposure, both positive and negative polarity discharges may occur.

ESD events are a major cause of failure in integrated circuits. ESD events may occur during wafer sawing and packaging of integrated circuits, and during handling of packaged integrated circuits such as when integrated circuits are being inserted into printed circuit boards by plugging them into sockets, or by soldering, or flip chip assembly. ESD events may cause an integrated circuit to fail outright or may degrade the integrated circuit causing an early failure of the electronic assembly during use. Maintaining control of ESD events in an integrated circuit manufacturing line can be difficult and costly.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An ESD monitor device may take the form of an integrated circuit with a plurality of monitor components available at each input/output (I/O) site of the ESD monitor device. Each monitor component has a physical structure which provides scalable ESD robustness. The monitor components are connected between each I/O site and a common ESD bus.

An integrated circuit may be formed by processing an ESD monitor device through one or more process steps of an integrated circuit manufacturing line, and subsequently measuring the ESD monitor device. Parameters of a process step of the manufacturing line may be adjusted to reduce ESD events at the process step, based on measurement results from the ESD monitor device. The integrated circuit may subsequently be processed through the adjusted process step.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An ESD monitor device may be an integrated circuit with a plurality of monitor components available at each I/O site of the ESD monitor device. Each monitor component has a physical structure which provides scalable ESD robustness. Example ESD components include diodes, metal oxide semiconductor (MOS) transistors, bipolar junction transistors, junction field effect transistors (JFETs), silicon controlled rectifiers (SCRs), resistors and capacitors. The monitor components at each I/O site may have different sizes of the physical structure, and so have different degrees of ESD damage susceptibility.

The monitor components are connected between each I/O site and a common ESD bus. When the ESD monitor device is packaged, a monitor component at each I/O site is connected to a corresponding terminal, such as a pin or solder pad, of the package. Thus an ESD event at a terminal of the package will be experienced by the monitor component connected to that terminal. The ESD monitor device advantageously provides an ESD monitoring function at each connected pin of the package, which may not be available in product integrated circuits having dedicated circuitry at each I/O site.

The ESD event may cause degradation of the monitor component, depending on the ESD event and the damage susceptibility of the monitor component. Degradation above a measurable amount indicates an ESD event in excess of the ESD robustness, or rating, of the monitor component. For example, a pn diode used as a monitor component may have ESD rating which is a function of a perimeter of a pn junction of the diode. ESD rating may increase in a diode with a larger perimeter. An ESD event may damage the pn junction at the perimeter, so that reverse leakage current of the pn diode increases, or reverse breakdown voltage decreases, as a result of the ESD event. The reverse leakage current or the reverse breakdown voltage may provide an electrically measured parameter which indicates an ESD event in excess of the ESD rating. Other monitor components have other physical structures which provide ESD robustness and other electrically measured parameters associated with the physical structures which provide quantitative indicators of ESD events in excess of the ESD ratings.

An integrated circuit may be formed by processing an ESD monitor device through one or more process steps of an integrated circuit manufacturing line, and subsequently measuring electrical parameters of the ESD monitor device. Parameters of a process step of the manufacturing line may be adjusted to reduce ESD events at the process step, based on measurement results from the ESD monitor device. The integrated circuit may subsequently be processed through the adjusted process step. Adjusting the process step may advantageously reduce loss of integrated circuits due to ESD events.

Figure 1:
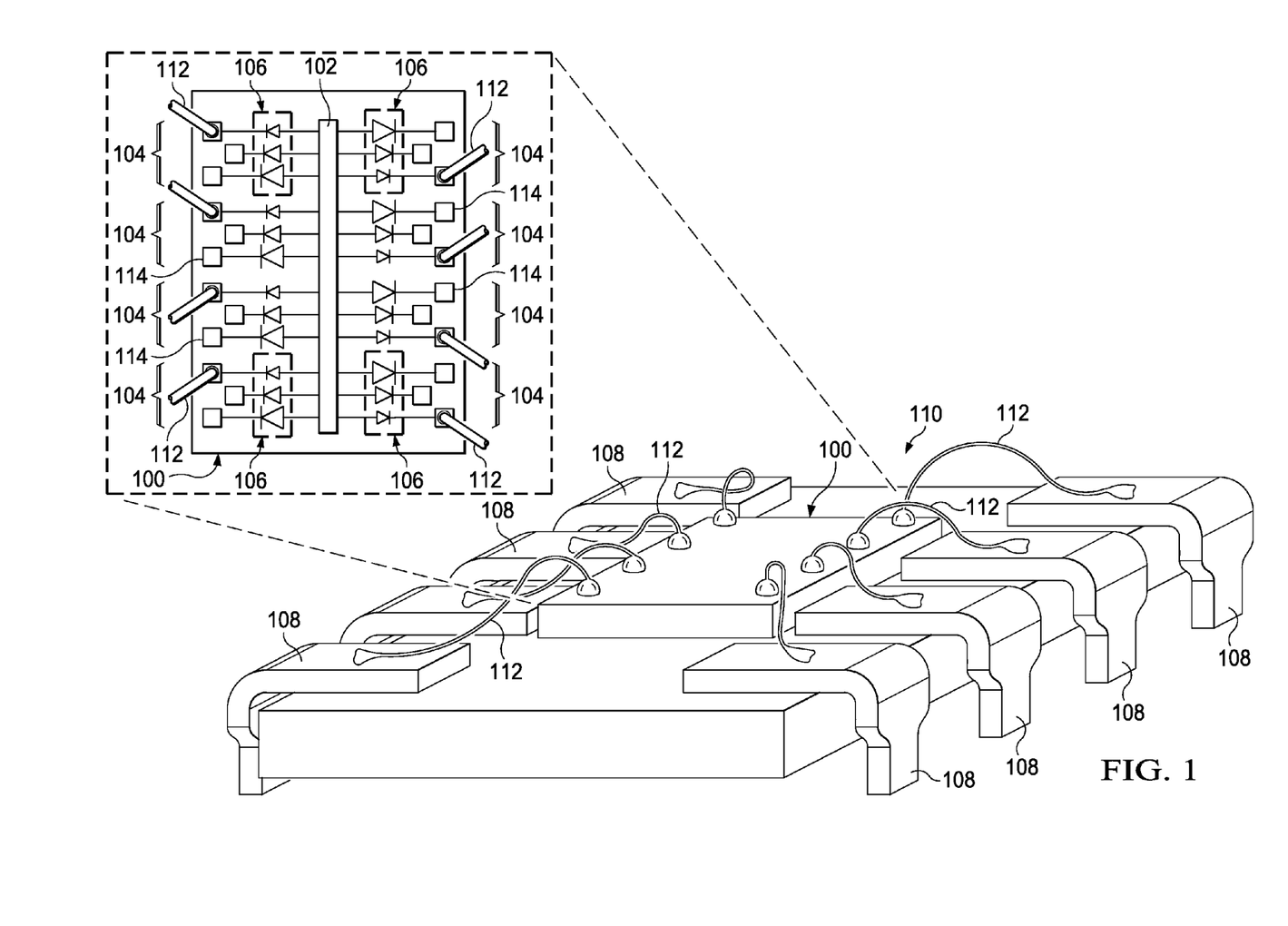
FIG. 1 depicts an ESD monitor device in a wire bonded package.

FIG. 1 depicts an ESD monitor device in a wire bonded package. The ESD monitor device 100 is an integrated circuit with an ESD bus 102 formed of metal interconnects above a semiconductor substrate. Each I/O site 104 of the ESD monitor device 100 has a plurality of monitor components 106 available. The monitor components 106 may be, for example, diodes as depicted in FIG. 1. Other example monitor components 106 may be MOS transistors, bipolar junction transistors, JFETs, SCRs, resistors and/or capacitors.

Each monitor component 106 has at least one scalable physical structure which provides a defined level of ESD robustness. For example, a monitor component may sized so as to be rated for the Human Body Model at 500 volts. The diodes 106 have pn junctions with perimeters which provide such a scalable physical structure. A diode 106 with a larger perimeter has more ESD robustness than a similar diode 106 with a smaller perimeter. The monitor components 106 at each I/O site 104 may have different sizes of the physical structure, as indicated by the different sizes of the diodes 106 in FIG. 1. An electrically measurable parameter, for example reverse leakage current or reverse breakdown voltage, corresponds to the physical structure, the pn junction perimeter, providing a quantitative indicator of an ESD event. In the instant example, the reverse leakage current may increase after an ESD event; the increased current may occur at the perimeter of the pn junction. An increase of the reverse leakage current of a specified amount, for example 10 percent, over the leakage current before the ESD event, may be used as an indicator of an ESD event above the rated level. Similarly, the reverse breakdown voltage may decrease after the ESD event; the breakdown may occur at the perimeter. A decrease of the reverse breakdown voltage of 10 percent, compared to the reverse breakdown before the ESD event, may be used as an indicator of an ESD event above the ESD rating.

The sizes of the physical structures of the monitor components 106 may be selected to provide ESD ratings that corresponds to standard levels recognized in the semiconductor industry. For example, a first monitor component 106 at each I/O site 104 may be sized so that an ESD event corresponding to the Human Body Model Class 1A may cause a specified change, for example 10 percent, in the electrically measurable parameter. A Human Body Model Class 1A ESD event charges a 100 picofarad capacitor to 250 volts to 500 volts, and discharges the capacitor through a 1.5 kilohm resistor through the ESD monitor device 100. Alternately, the first monitor component 106 may be sized so that an ESD event corresponding to the Machine Model Class M1B may cause the specified change in the electrically measurable parameter. A Machine Model Class M1B ESD event charges a 200 picofarad capacitor to 25 volts to 50 volts, and discharges the capacitor through a low impedance such as a 0.5 microhenry inductor through the ESD monitor device 100. In another alternative, the first monitor component 106 may be sized so that an ESD event corresponding to the Charged Device Model Class C2 may cause a 10 percent change in the electrically measurable parameter. A Charged Device Model Class C2 ESD event charges the ESD monitor device 100 to 125 volts to 250 volts while situated over a ground plate, and discharges the ESD monitor device 100 through a parasitic inductance and a 1 ohm resistor.

Similarly, a second monitor component 106 at each I/O site 104 may be sized so that an ESD event corresponding to the Human Body Model Class 1B, which is performed at 500 volts to 1000 volts, may cause the specified change in the electrically measurable parameter. Alternately, the second monitor component 106 may be sized for the Machine Model Class M1C which is performed at 50 volts to 100 volts, or may be sized for the Charged Device Model Class C3 which is performed at 250 volts to 500 volts. Additional monitor components 106 at each I/O site 104 may be sized for increasing classes of the respective Human Body Model, Machine Model or Charged Device Model.

In another version of the instant example, the first monitor component 106 at each I/O site 104 may be sized for the Human Body Model Class 1A, the second monitor component 106 at each I/O site 104 may be sized for the Machine Model Class M1B, and a third monitor component 106 at each I/O site 104 may be sized for the Charged Device Model Class C2.

A monitor component 106 at each I/O site 104 is connected to a corresponding terminal 108 of the package 110. In the instant example, the connections are made by wire bonds 112 to bond pads 114 connected to each monitor component 106. The package 110 may subsequently be encapsulated in an epoxy-based compound or otherwise sealed. The ESD monitor device 100 in the package 110 may be processed in a manufacturing line used for fabrication of integrated circuits, including assembly and test of the integrated circuits. ESD events at the terminals 108 of the package 110 may cause the specified change in the electrically measurable parameter in the corresponding monitor component 106 connected to the terminal 108 through the corresponding wire bond 112. The ESD monitor device 100 may be subsequently tested to determine if any ESD events in excess of the rating of each monitor component 106 occurred.

Figure 2:
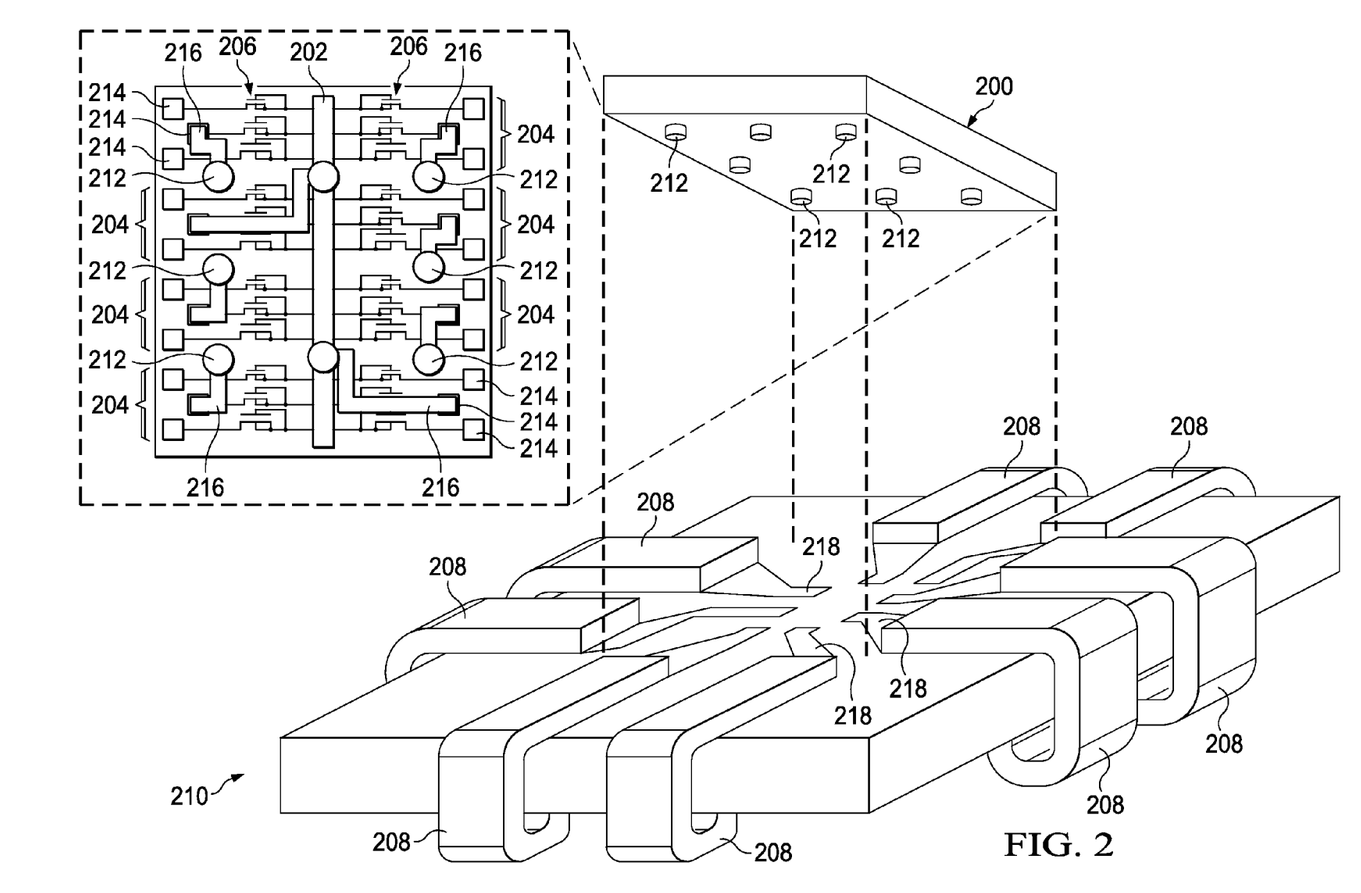
FIG. 2 depicts another ESD monitor device in a bump bonded package.

FIG. 2 depicts another ESD monitor device in a bump bonded package. The ESD monitor device 200 is an integrated circuit with an ESD bus 202 formed in metal interconnect levels above a semiconductor substrate. Each I/O site 204 of the ESD monitor device 200 has a plurality of monitor components 206 available. The monitor components 206 may be, for example, MOS transistors as depicted in FIG. 2. Other example monitor components 206 may be diodes, bipolar junction transistors, JFETs, SCRs, resistors and/or capacitors. Each monitor component 206 has at least one scalable physical structure which provides a desired ESD rating. The MOS transistors 206 have channel widths which provide such a scalable physical structure. An electrically measurable parameter, for example off-state leakage current or drain to source breakdown voltage (BVDSS), corresponds to the physical structure, the channel width, providing a quantitative indicator of an ESD event. The monitor components 206 at each I/O site 204 may be sized, for example, as described in the examples discussed in reference to FIG. 1.

A monitor component 206 at each I/O site 204 is connected to a corresponding terminal 208 of the package 210 through routing leads 218. In the instant example, the connections are made by bump bonds 212 through a redistribution layer 216 to bond pads 214 connected to each monitor component 206. The package 210 may subsequently be encapsulated in an epoxy-based compound or otherwise sealed. The ESD monitor device 200 in the package 210 may be processed in a manufacturing line used for fabrication of integrated circuits, including assembly and test of the integrated circuits, and subsequently tested to determine if any ESD events in excess of the ESD ratings of the monitor components 206 occurred.

Assembling the ESD monitor device 100 in the wire bonded package 110 and/or assembling the ESD monitor device 200 in the bump bonded package 210 advantageously enables ESD events which occur at any terminals 108 and 208 of the packages 110 and 210 to be characterized.

Figure 3:
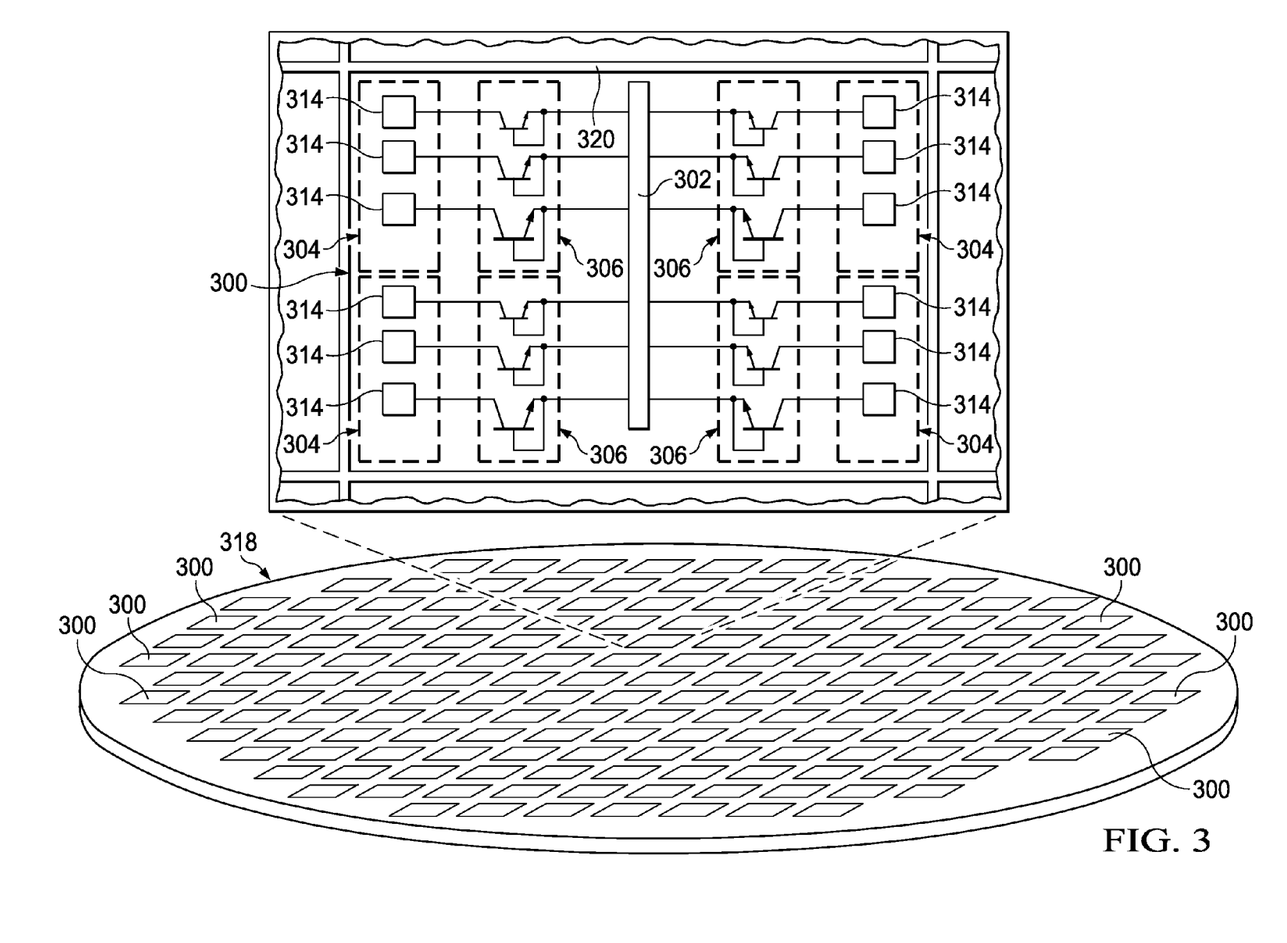
FIG. 3 depicts a further ESD monitor device in a semiconductor wafer containing a plurality of the ESD monitor devices.

FIG. 3 depicts a further ESD monitor device in a semiconductor wafer containing a plurality of the ESD monitor devices. The ESD monitor device 300 is separated from other instances of the ESD monitor devices 300 in the semiconductor wafer 318 by scribe lanes 320. The ESD monitor device 300 is an integrated circuit with an ESD bus 302 formed in metal interconnect levels above a semiconductor substrate. Each I/O site 304 of the ESD monitor device 300 has a plurality of monitor components 306 available. The monitor components 306 may be, for example, bipolar junction transistors as depicted in FIG. 3. Other example monitor components 306 may be diodes, MOS transistors, JFETs, SCRs, resistors and/or capacitors. Each monitor component 306 has at least one scalable physical structure which provides ESD robustness. The bipolar junction transistors 306 have collector-base junction perimeters which provide such a scalable physical structure. An electrically measurable parameter, for example base current or collector-base breakdown voltage (BVCSS), corresponds to the physical structure, the collector-base junction perimeter, providing a quantitative indicator that an ESD event in excess of the ESD rating of the monitor component 306 has occurred. The monitor components 306 at each I/O site 304 may be sized, for example, as described in the examples discussed in reference to FIG. 1.

Each monitor component 306 is connected to a bond pad 314 in the ESD monitor device 300. The bond pads 314 may be probed to provide electrical measurement data for the electrically measurable parameter. A bond pad 314 at each I/O site 304 may be connected to a terminal of a package by wire bonding or bump bonding, as described in reference to FIG. 1 and FIG. 2. Providing the ESD monitor device 300 in the semiconductor wafer 318 may advantageously enable characterizing ESD events which occur during wafer sawing and assembly processes, for example die attach.

Figure 4:
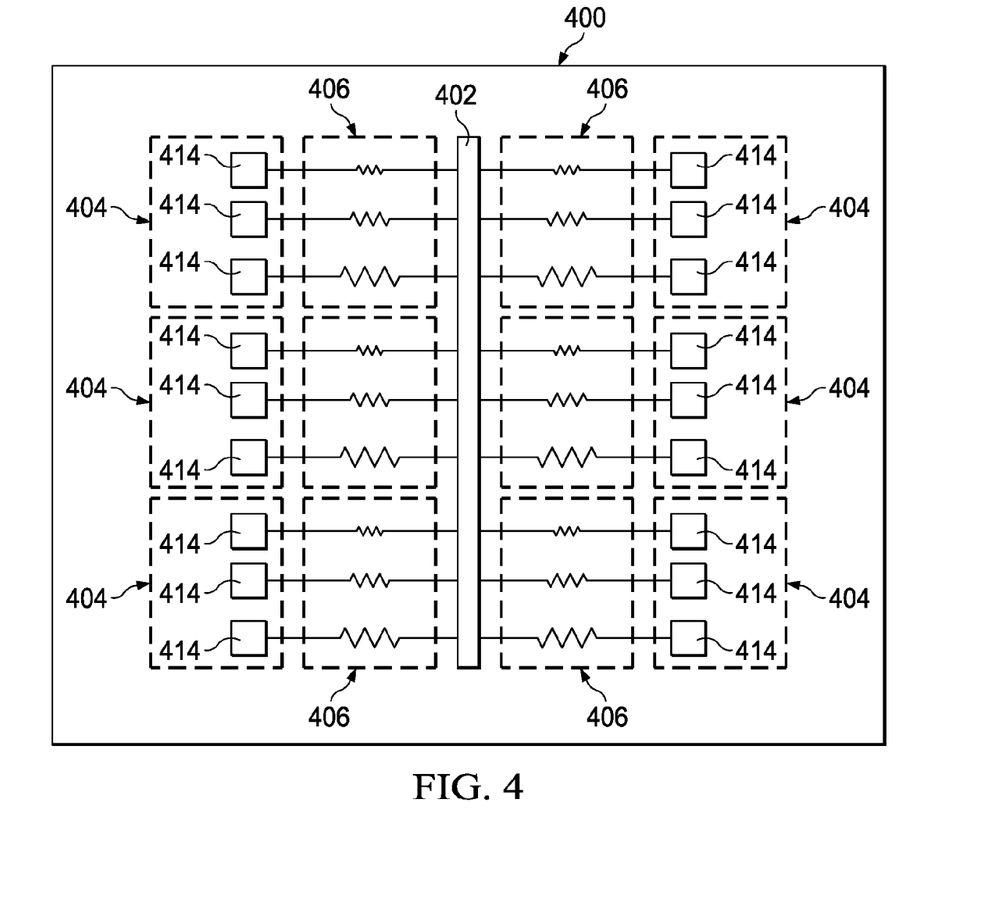
FIG. 4 through FIG. 7 depict additional examples of ESD monitor devices.

FIG. 4 through FIG. 7 depict additional examples of ESD monitor devices. Referring to FIG. 4, the ESD monitor device 400 is an integrated circuit with an ESD bus 402 formed in metal interconnect levels above a semiconductor substrate. Each I/O site 404 of the ESD monitor device 400 has a plurality of bond pads 414; each bond pad 414 is connected to a separate monitor component 406. In the instant example, the monitor components 406 are resistors 406, for example polysilicon resistors 406. An area of a resistor body of each resistor 406 may be a scalable physical structure which provides ESD robustness. Electrical resistance at low power, that is a power which does not increase a temperature of the resistor 406 more than a few degrees Kelvin, may be an electrically measurable parameter corresponding to the area of a resistor body which indicates an ESD event in excess of the ESD rating of the monitor component 406 has occurred.

Figure 5:
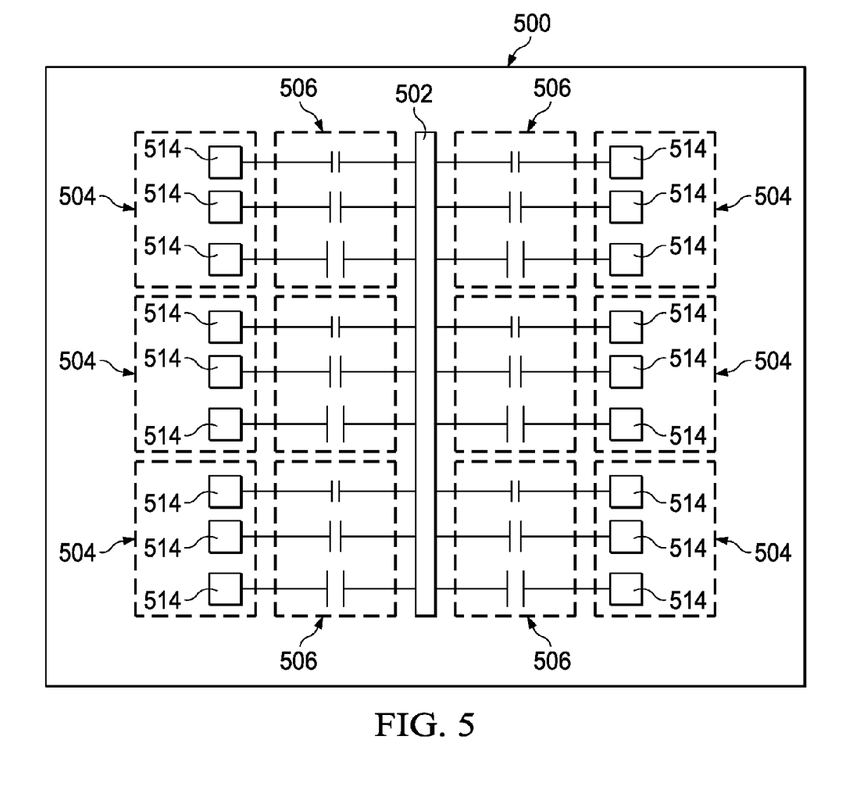

Referring to FIG. 5, the ESD monitor device 500 is an integrated circuit with an ESD bus 502 formed in metal interconnect levels above a semiconductor substrate. Each I/O site 504 of the ESD monitor device 500 has a plurality of bond pads 514; each bond pad 514 is connected to a separate monitor component 506. In the instant example, the monitor components 506 are capacitors 506, for example gate to substrate capacitors 506. A thickness of a capacitor dielectric layer, in this case a gate dielectric layer, of each capacitor 506 may be a scalable physical structure which provides ESD robustness. Leakage current may be an electrically measurable parameter corresponding to the thickness of the capacitor dielectric layer which indicates an ESD event in excess of the ESD rating of the monitor component 506 has occurred.

Figure 6:
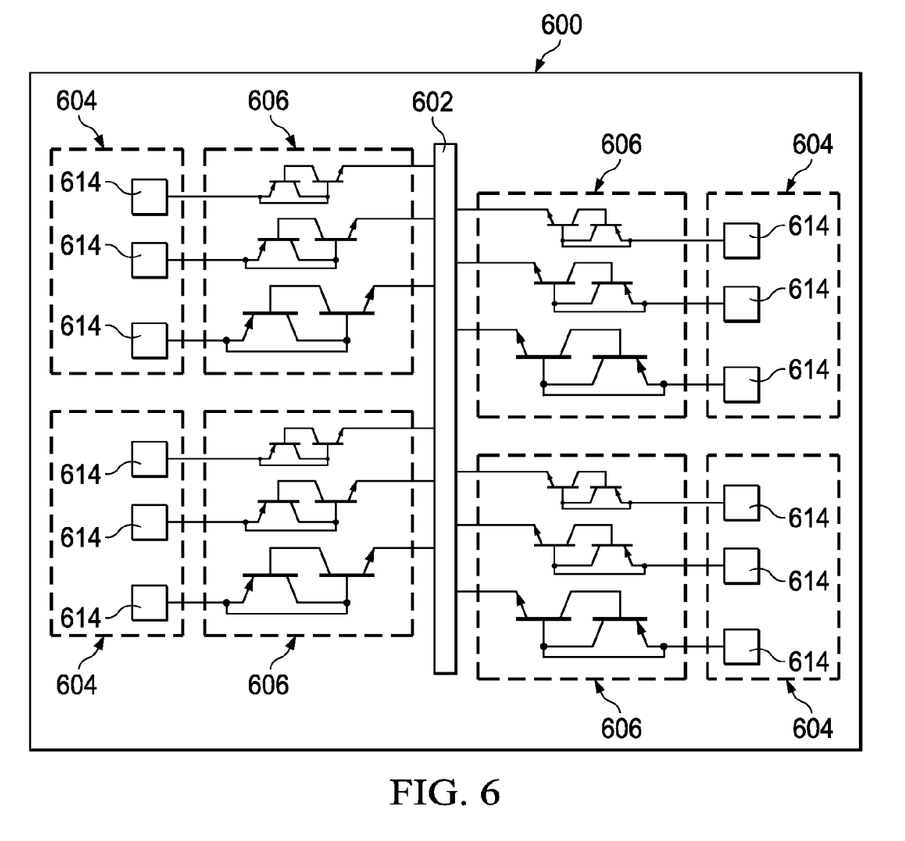

Referring to FIG. 6, the ESD monitor device 600 is an integrated circuit with an ESD bus 602 formed in metal interconnect levels above a semiconductor substrate. Each I/O site 604 of the ESD monitor device 600 has a plurality of bond pads 614; each bond pad 614 is connected to a separate monitor component 606. In the instant example, the monitor components 606 are SCRs 606. A perimeter of an anode junction of each SCR 606 may be a scalable physical structure which provides ESD robustness. Breakdown voltage may be an electrically measurable parameter corresponding to the perimeter of the anode junction which indicates an ESD event in excess of the ESD rating of the monitor component 606 has occurred.

Figure 7:
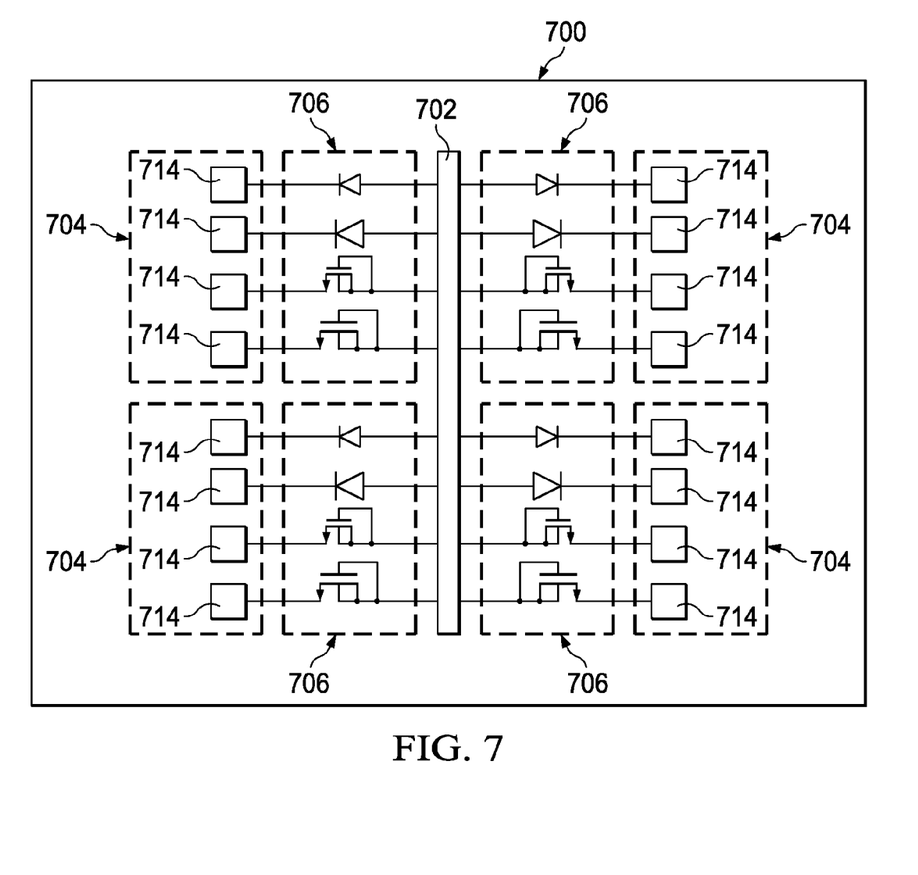

Referring to FIG. 7, the ESD monitor device 700 is an integrated circuit with an ESD bus 702 formed in metal interconnect levels above a semiconductor substrate. Each I/O site 704 of the ESD monitor device 700 has a plurality of bond pads 714; each bond pad 714 is connected to a separate monitor component 706. In the instant example, the monitor components 706 include a plurality of component types, such as diodes 706 and MOS transistors 706 as depicted in FIG. 7. Providing a plurality of component types for the plurality of monitor components 706 at each I/O site 704 may advantageously enable using a single type of ESD monitor device 700 for characterizing ESD events for more than one component type, thus saving costs in a manufacturing line fabricating integrated circuit.

The monitor components 406, 506, 606 and/or 706 at each I/O site 404, 504, 604 and 704 may be sized, for example, as described in the examples discussed in reference to FIG. 1. The ESD monitor devices 400, 500, 600 and 700 may be assembled into wire bonded package as described in reference to FIG. 1 or assembled into bump bonded packages as described in reference to FIG. 2, and accrue the advantages to the manufacturing line described in reference thereof. Further, the ESD monitor devices 400, 500, 600 and 700 may be assembled into other types of integrated circuit packages and accrue the advantages to the manufacturing line described in reference thereof.

Figure 8:
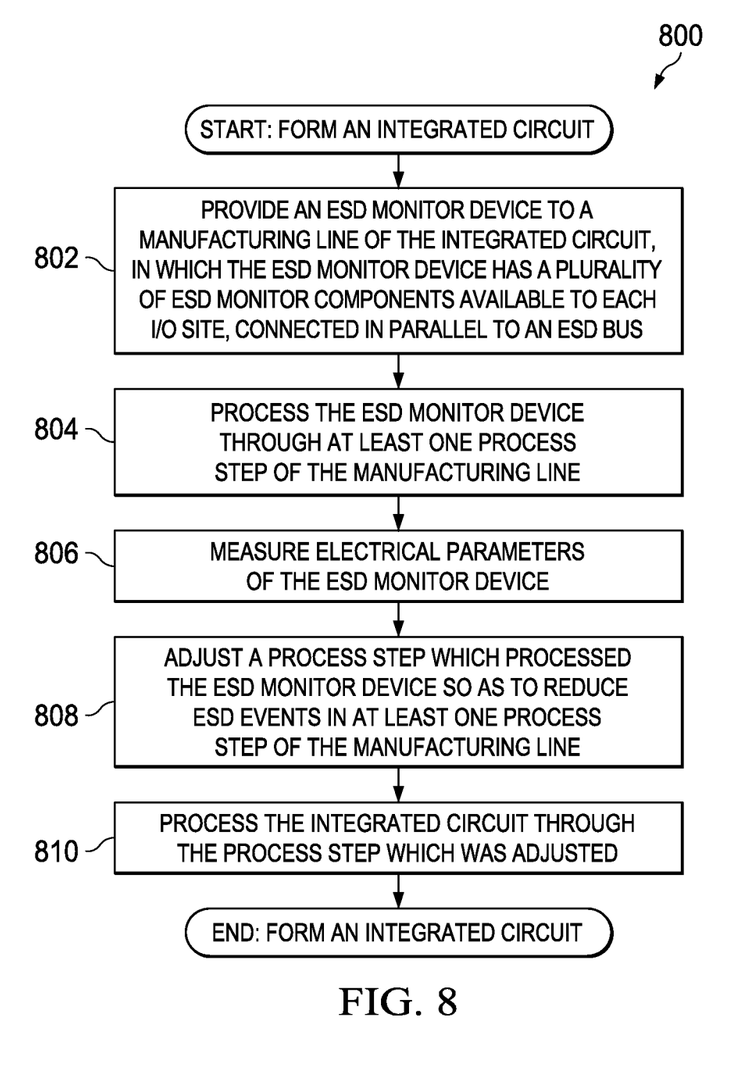
FIG. 8 is a flowchart of a method of forming an integrated circuit which makes use of an ESD monitor device.

FIG. 8 is a flowchart of a method of forming an integrated circuit which makes use of an ESD monitor device. The process 800 begins with step 802 which is to provide an ESD monitor device to a manufacturing line which will form the integrated circuit. The ESD monitor device has a plurality of monitor components available at each I/O site of the ESD monitor device. Each monitor component has a physical structure which provides scalable ESD robustness. The monitor components are connected in between each I/O site and a common ESD bus of the ESD monitor device. The ESD monitor device may be disposed in a semiconductor wafer as described in reference to FIG. 3, may be in individual unpackaged die form, or may be packaged in an integrated circuit package as described in reference to FIG. 1 or FIG. 2.

In step 804, the ESD monitor device is processed through at least one process step of the manufacturing line. The process step is a process step that will be used to form the integrated circuit. The process step may be, for example, a wafer backgrind step, wafer scribing or wafer sawing, a die attach step which attaches the singulated ESD monitor device in an integrated circuit package, a wire bonding step in which monitor components of the ESD monitor device are connected to terminals of the package through wire bonds, a bump bonding step in which monitor components of the ESD monitor device are connected to terminals of the package through bump bonds, a package encapsulation step, a lid attach step which attaches a lid over the ESD monitor device in the integrated circuit package, a package marking step, a package level test step, a board insertion step which inserts the packaged ESD monitor device in a circuit board, and/or a solder step which solders the packaged ESD monitor device in the circuit board.

Subsequently, in step 806, the ESD monitor chip is tested to obtain measurements of electrical parameters associated with scalable physical structures of the ESD monitor components which provide ESD robustness. Occurrence of ESD events in excess of the ESD ratings of the monitor components is deduced from the measurements. The electrical parameters may optionally have been tested prior to executing step 804 so as to provide reference data for the measurements of the instant step.

Step 808 is to adjust a process step of the manufacturing line based on the measurements obtained in step 806 so as to reduce ESD events in at least one process step of the manufacturing line. The adjusted process step is a process step that will be used to form the integrated circuit. The process step in which ESD events are reduced may be, but is not necessarily, the process step through which the ESD monitor device was processed.

Subsequently, step 810 is to process the integrated circuit through the process step which was adjusted in step 808. The integrated circuit advantageously has a reduced risk of ESD events at the process step, and thus may be more reliable that a similar integrated circuit which experienced an ESD event at that process step.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An electrostatic discharge (ESD) monitor device, comprising:
   an ESD bus comprising metal interconnects above a substrate of said ESD monitor device, said substrate comprising a semiconductor;
   a plurality of input/output (I/O) sites; and
   a plurality of monitor components disposed at each of said I/O sites, each of said monitor components comprising a scalable physical structure which provides ESD robustness, each of said monitor components being electrically connected to said ESD bus.

2. The ESD monitor device of claim 1, wherein said monitor components are selected from the group consisting of diodes, metal oxide semiconductor (MOS) transistors, bipolar junction transistors, resistors, capacitors and silicon controlled rectifiers (SCRs).

3. The ESD monitor device of claim 1, wherein said monitor components are all diodes.

4. The ESD monitor device of claim 1, wherein said monitor components are all MOS transistors.

5. The ESD monitor device of claim 1, wherein said monitor components are all SCRs.

6. The ESD monitor device of claim 1, wherein said monitor components are all bipolar junction transistors.

7. The ESD monitor device of claim 1, wherein said monitor components are all capacitors.

8. The ESD monitor device of claim 1, wherein said monitor components at each said I/O site include a plurality of component types.

9. A method of forming an integrated circuit, comprising the steps of:
   providing an ESD monitor device to a manufacturing line of said integrated circuit, said ESD monitor device comprising:
      an ESD bus comprising metal interconnects above a substrate of said ESD monitor device, said substrate comprising a semiconductor;
      a plurality of input/output (I/O) sites; and
      a plurality of monitor components disposed at each of said I/O sites, each of said monitor components comprising a scalable physical structure which provides ESD robustness, each of said monitor components being electrically connected to said ESD bus;
   connecting one monitor device of said plurality of said monitor devices at each said I/O site between said I/O site and said ESD bus;
   processing said ESD monitor device through at least one process step of said manufacturing line, said process step being a process step which will be used to form said integrated circuit;
   subsequently measuring an electrical parameter of said monitor components, said electrical parameters corresponding to said physical structure, so as to determine occurrence of ESD events in excess of said ESD robustness;

adjusting a process step of said manufacturing line so as to reduce ESD events in at least one process step of said manufacturing line, said process step that is adjusted being a process step which will be used to form said integrated circuit; and subsequently processing said integrated circuit through said process step that was adjusted.

10. The method of claim 9, wherein said monitor components are selected from the group consisting of diodes, MOS transistors, bipolar junction transistors, resistors, capacitors and SCRs.

11. The method of claim 9, wherein said monitor components are all from one component type.

12. The method of claim 9, wherein said monitor components at each said I/O site include a plurality of component types.

13. The method of claim 9, wherein said ESD monitor device further comprises bond pads attached to each of said monitor components, and further comprising the steps of:
  placing said ESD monitor device in an integrated circuit package; and
  making wire bond connections to electrically connect a bond pad at each of a plurality of said I/O sites to a plurality of terminals of said integrated circuit package.

14. The method of claim 9, wherein said ESD monitor device further comprises bump bonds attached to each of said monitor components, and further comprising the steps of:
  placing said ESD monitor device in an integrated circuit package; and
  making bump bond connections to electrically connect a bond pad at each of a plurality of said I/O sites to a plurality of terminals of said integrated circuit package.

15. The method of claim 9, wherein said process step that is adjusted is a board insertion step.

16. The method of claim 9, wherein said process step that is adjusted is a solder step.

17. The method of claim 9, wherein said physical structure of a first monitor component of said plurality of monitor components at each said I/O site is sized so that a measured value of said electrical parameter changes by at least 10 percent when said first monitor component is exposed to a Human Body Model Class 1A ESD event.

18. The method of claim 9, wherein said physical structure of a first monitor component of said plurality of monitor components at each said I/O site is sized so that a measured value of said electrical parameter changes by at least 10 percent when said first monitor component is exposed to a Machine Model Class M1B ESD event.

19. The method of claim 9, wherein said physical structure of a first monitor component of said plurality of monitor components at each said I/O site is sized so that a measured value of said electrical parameter changes by at least 10 percent when said first monitor component is exposed to a Charged Device Model Class C2 ESD event.

\* \* \* \* \*